US008018782B2

(12) United States Patent
Park et al.

(10) Patent No.: US 8,018,782 B2
(45) Date of Patent: Sep. 13, 2011

(54) NON-VOLATILE MEMORY DEVICES AND METHODS OF ERASING NON-VOLATILE MEMORY DEVICES

(75) Inventors: Kitae Park, Seongnam-si (KR); Doogon Kim, Hwaseong-si (KR); Moosung Kim, Yongin-si (KR); Hansoo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 224 days.

(21) Appl. No.: 12/486,056

(22) Filed: Jun. 17, 2009

(65) Prior Publication Data

US 2009/0316491 A1     Dec. 24, 2009

(30) Foreign Application Priority Data

Jun. 23, 2008   (KR) ................ 10-2008-0059081

(51) Int. Cl.
*G11C 16/04* (2006.01)
*G11C 16/06* (2006.01)

(52) U.S. Cl. ......... 365/185.29; 365/185.02; 365/185.17; 365/185.2; 365/185.33

(58) Field of Classification Search ............. 365/185.29
See application file for complete search history.

(56) References Cited

U.S. PATENT DOCUMENTS

| 5,293,337 | A | * | 3/1994 | Aritome et al. | 365/185.17 |
|---|---|---|---|---|---|
| 5,579,259 | A | * | 11/1996 | Samachisa et al. | 365/185.14 |
| 6,618,292 | B2 | | 9/2003 | Sakui | |
| 7,333,367 | B2 | * | 2/2008 | Lee et al. | 365/185.2 |
| 7,652,926 | B2 | * | 1/2010 | Kang et al. | 365/185.2 |
| 7,830,724 | B2 | * | 11/2010 | Park et al. | 365/185.29 |
| 7,839,694 | B2 | * | 11/2010 | Joe et al. | 365/185.23 |
| 2006/0139997 | A1 | * | 6/2006 | Park et al. | 365/185.2 |
| 2006/0239077 | A1 | * | 10/2006 | Park et al. | 365/185.17 |
| 2007/0171728 | A1 | * | 7/2007 | Cho | 365/185.29 |
| 2007/0206416 | A1 | * | 9/2007 | Hazama et al. | 365/185.05 |
| 2008/0084761 | A1 | * | 4/2008 | Lee et al. | 365/185.28 |
| 2008/0144378 | A1 | * | 6/2008 | Park et al. | 365/185.05 |
| 2008/0304326 | A1 | * | 12/2008 | Kim et al. | 365/185.22 |
| 2009/0003067 | A1 | * | 1/2009 | Kang et al. | 365/185.13 |
| 2009/0103371 | A1 | * | 4/2009 | Goda et al. | 365/185.29 |
| 2009/0135656 | A1 | * | 5/2009 | Park | 365/185.19 |
| 2010/0046290 | A1 | * | 2/2010 | Park et al. | 365/185.2 |
| 2010/0054036 | A1 | * | 3/2010 | Lee et al. | 365/185.03 |

FOREIGN PATENT DOCUMENTS

| JP | 2002-150782 | 5/2002 |
|---|---|---|
| JP | 2005-063650 | 3/2005 |
| KR | 10-2002-0042756 | 6/2002 |
| KR | 10-2005-0021616 | 3/2005 |
| KR | 10-2006-0110755 | 10/2006 |
| KR | 10-2007-0022812 | 2/2007 |

* cited by examiner

*Primary Examiner* — Son L Mai

(74) *Attorney, Agent, or Firm* — Harness, Dickey & Pierce

(57) ABSTRACT

In one embodiment, an erase method for a memory including a memory array having at least first and second programmable transistors connected in series, includes restricting flow of electrons from the first programmable transistor into the second programmable transistor during an erase operation.

39 Claims, 14 Drawing Sheets

NON-VOLATILE MEMORY DEVICES AND METHODS OF ERASING NON-VOLATILE MEMORY DEVICES

PRIORITY STATEMENT

This non-provisional U.S. patent application claims priority under 35 U.S.C. §119 to Korean Patent Application No. 10-2008-0059081, filed on Jun. 23, 2008, in the Korean Intellectual Property Office (KIPO), the entire contents of which are incorporated herein by reference.

BACKGROUND

Volatile and nonvolatile memories are utilized more and more in mobile apparatuses such as MP3 players, personal multimedia players (PMP), mobile phones, notebook computers, personal digital assistants (PDA), etc. These mobile apparatuses require storage units with greater storage capacity for providing various functions (e.g., playing motion pictures). One example of larger capacity storage units is a multi-bit memory device in which each memory cell stores multi-bit data (e.g., 2 or more bits of data). For the sake of clarity, a memory cell storing multi-bit data is hereinafter referred to as multi-level cell (MLC).

One class of non-volatile memory is a flash memory, which can erase data in units of blocks including several tens to hundreds of bytes and which can record data in units bytes or pages. Flash memories usually come in two types: NOR and NAND. In a NOR type flash memory, memory cells are connected in parallel, while in a NAND type flash memory, memory cells are connected in series. NAND type flash memories are often used for data storage, where data files for image data, music data, voice data, etc. are recorded and read sequentially. In a NAND type flash memory, the string of memory cells is connected between a string selection transistor and a ground selection transistor. During an erase operation, the string and ground selection transistors have floating gates, and thus are affected by the voltages applied to the memory cells, substrate, etc. during an erase operation. As a result, the erase operation can adversely increase the threshold voltage of the string and ground selection transistors.

SUMMARY

Example embodiments provide non-volatile memory devices and/or methods for erasing the same.

In one embodiment, an erase method for a memory including a memory array having at least first and second programmable transistors connected in series, includes restricting flow of electrons from the first programmable transistor into the second programmable transistor during an erase operation.

For example, the restricting may apply a first voltage to a control gate of the first programmable transistor. The method may also include applying a second voltage to at least a portion of the substrate including the first and second programmable transistors. And, the first voltage may be less than the second voltage.

An embodiment of a memory may include a memory array having a plurality of memory strings. At least one memory string includes a first selection transistor and a second selection transistor connected in series to a plurality of memory cell transistors. The first selection transistor, the second selection transistor and the plurality of memory cell transistors are programmable transistors. The memory further includes a drive unit and a control unit. The drive unit is configured to apply voltages to a plurality of word lines. Each of the plurality of word lines is connected to a gate of a respective one of the plurality of memory cell transistors. The drive unit is also configured to apply voltages to first and second selection lines connected to gates of the first and second selection transistors, respectively. The control unit is configured to control the drive unit such that during an erase operation, electrons are restricted from flowing from the first selection transistor into the second selection transistor.

For example, the control unit is configured to control the drive unit to apply a first voltage to a control gate of the first selection transistor.

The control unit may also be configured to control the drive unit to apply a second voltage to at least a portion of the substrate including the plurality of memory cell transistors during the erase operation. The first voltage may be less than the second voltage.

In another embodiment, the memory includes a memory array having a plurality of memory strings. At least one memory string includes a first selection transistor connected in series to a plurality of memory cell transistors. The first selection transistor and the plurality of memory cell transistors are programmable transistors. The memory further includes a drive unit and a control unit. The drive unit is configured to apply voltages to a plurality of word lines. Each of the plurality of word lines is connected to a gate of a respective one of the plurality of memory cell transistors. The drive unit is also configured to apply a voltage to a first selection line connected to a gate of the first selection transistor. The control unit is configured to control the drive unit such that during an erase operation, electrons are restricted from flowing to the first selection transistor from the plurality of memory cell transistors.

For example, the control unit is configured to control the drive unit to apply a first voltage to a control gate of the first selection transistor.

The control unit may also be configured to control the drive unit to apply a second voltage to at least a portion of the substrate including the plurality of memory cell transistors during the erase operation. The first voltage may be less than the second voltage.

The present invention also relates to implementations of the non-volatile memory device.

For example, one example implementation is a card. In one embodiment, the card includes a memory and a control unit configured to control the memory. The memory includes a memory array having a plurality of memory strings. At least one memory string includes a first selection transistor connected in series to a plurality of memory cell transistors. The first selection transistor and the plurality of memory cell transistors are programmable transistors. The memory further includes a drive unit and a control unit. The drive unit is configured to apply voltages to a plurality of word lines. Each of the plurality of word lines is connected to a gate of a respective one of the plurality of memory cell transistors. The drive unit is also configured to apply a voltage to a first selection line connected to a gate of the first selection transistor. The control unit is configured to control the drive unit such that during an erase operation, electrons are restricted from flowing to the first selection transistor from the plurality of memory cell transistors.

Another example implementation is a system. In one embodiment, the system includes a bus, a semiconductor device connected to the bus, an input/output device connected to the bus, and a processor connected to the bus. The processor is configured to communicate with the input/output device and the semiconductor device via the bus. The semiconductor device includes a memory array having a plurality of memory strings. At least one memory string includes a first selection transistor connected in series to a plurality of memory cell transistors. The first selection transistor and the plurality of memory cell transistors are programmable transistors. The memory further includes a drive unit and a control unit. The drive unit is configured to apply voltages to a plurality of word lines. Each of the plurality of word lines is connected to a gate of a respective one of the plurality of memory cell transistors. The drive unit is also configured to apply a voltage to a first selection line connected to a gate of the first selection transistor. The control unit is configured to control the drive unit such that during an erase operation, electrons are restricted from flowing to the first selection transistor from the plurality of memory cell transistors.

BRIEF DESCRIPTION OF THE DRAWINGS

Non-limiting and non-exhaustive example embodiments will be described with reference to the following figures, wherein like reference numerals refer to like parts throughout the various figures unless otherwise specified. In the figures.

DETAILED DESCRIPTION OF EXAMPLE EMBODIMENTS

Figure 1:
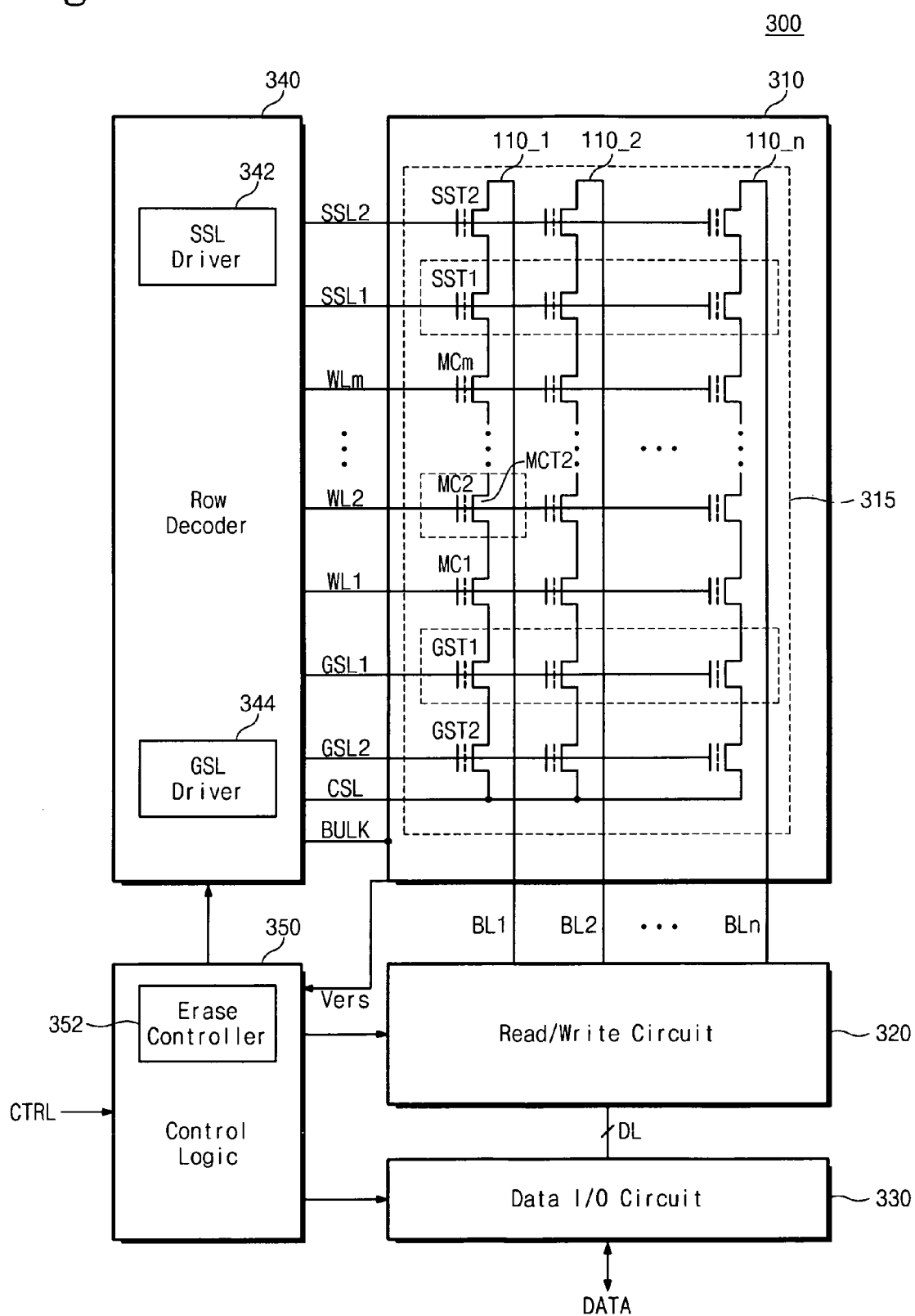
FIG. 1 illustrates a non-volatile memory device according to an embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram illustrating a non-volatile memory device according to an example embodiment. The non-volatile memory device may be a flash memory device such as a NAND flash. As shown, the non-volatile memory device 300 may include a non-volatile cell array 310, a read/write circuit 320, a data input/output (I/O) circuit 330, a row decoder 340 and control logic 350. As shown, the cell array 310 may include a plurality or pluralities of memory cells MC arranged at intersections of word lines WL and bit lines BL. The cell array 310 may be composed of memory blocks 315 (only one of which is shown in FIG. 1 for clarity), each of which may provide a unit of erasure. Each memory block may also be defined as a programming unit and may be segmented into a plurality of pages. Each page may be a group of memory cells MC sharing a word line WL.

As shown in FIG. 1, the memory cells MC are also grouped into strings 110_$i$. Each string 110_$i$ includes a second ground selection transistor GST2, a first ground selection transistor GST1, a plurality of memory cell transistors MCT1-MCTm forming memory cells MC, a first string selection transistor SST1 and a second string selection transistor SST2 connected in series between an associated bit line BLi and a common source line CSL. The gates of the first ground selection transistor GST1, the second ground selection transistor GST2, the first string selection transistor SST1 and the second string selection transistor SST2 are connected to a first ground source line GSL1, a second ground source line GSL2, a first string selection line SSL1 and a second string selection line SSL2, respectively. The gates of the memory cell transistors MCT are connected to respective word lines WLs. In this embodiment, the first string selection transistor SST1 and the first ground selection transistor GST1 may be dummy memory cells.

The row decoder 340 acts as a driver or drive unit, and selectively applies voltages to the first and second ground source lines GSL1 and GSL2, the first and second string selection lines SSL1 and SSL2, the word lines WLs, the common source line CSL and the substrate or bulk region including the strings 110. In particular, the row decoder 340 includes an SSL driver 342 for driving the first and second string selection lines SSL1 and SSL2, and the row decoder 340 includes a GSL driver 344 for driving the first and second ground selection lines GSL1 and GSL2.

The control logic 350 receives command information and address information. For example, the control logic 350 may receive a mode register set instructing a program operation, a read operation, an erase operation, etc. The control logic 350 may also receive address information associated with a command, and partially decode the address information. The control logic 350 controls the row decoder 340, the read/write circuit 320 and the data I/O circuit 330 based on the control and address information.

During a read operation, the control logic 350 receives a read command and read address information CTRL. The control logic 350 partially decodes the read address into row and column address information. The control logic 350 controls the row decoder 340 to generate voltages for reading data from the cell array 310, and supplies the row decoder 340 with the row address information. The row decoder 340 selectively supplies a common source voltage to the common source line CSL, word line voltages to the word lines WLs, string selection voltages to the string selection lines SSLi and ground selection voltages to the ground selection lines GSLi of the cell array 310 in response to the row address information. In at least this example embodiment, the row decoder 340 may select a memory block in response to a block address in the row address information, and select a page thereof. In applying voltages, the row decoder 340 applies a voltage high enough to turn on the string selection transistors SST1 and SST2, the ground selection transistors GST1 and GST2, and the memory cell transistors MCTs of unselected memory cells MCs. A low voltage, such as 0V may also be applied to the common source line CSL. The row decoder 340 also applies read voltages to the word line WL of the selection memory cell or cells. For example, the read voltages may be applied in a desired pattern to determine the threshold distribution state of a memory cell. As such read techniques are very well-known, a description thereof has been omitted for the sake of brevity.

The control logic 350 also controls the read/write circuit 320. The read/write circuit 320 may include a plurality or pluralities of page buffer units and each page buffer unit may correspond to at least one bit line of the cell array 310. The read/write circuit 320 may function as a sense amplifier during the read operation. Each page buffer unit may be electrically coupled to a bit line or one bit line of a bit line pair, and may be configured to read data bits from the cell array 310 through the bit line. The read/write circuit 320 transfers data to the data input/output circuit 330 according to the column address information supplied by the control logic 350. During the read operation, the data input/output circuit 330 may transfer read data to an external device.

For a program operation, incremental step pulse programming (ISPP) may be performed. During a program operation, the control logic 350 receives the program (or write) command and program address information. The control logic 350 partially decodes the program address information into row and column address information. The control logic 350 controls the row decoder 340 to generate voltages for programming data in the cell array 310, and supplies the row decoder 340 with the row address information. The row decoder 340 selectively supplies word line voltages to word lines WLs of the cell array 310 in response to the row address information. In at least this example embodiment, the row decoder 340 may select a memory block in response to a block address, and select a page thereof. In applying voltages, the row decoder 340 (more specifically, the SSL driver 342 and the GSL driver 344) applies a voltage high enough to turn on the string selection transistors SST1 and SST2, and applies a low voltage to the ground source transistors GST1 and GST2. The row decoder 340 supplies a non-selection voltage to the memory cell transistors MCTs of unselected memory cells MCs such that these unselected memory cells MCs are prevented from changing their threshold distribution states. The row decoder 340 also applies a program voltage Vpgm to the word line WL of the selected memory cell or cells. The program voltage Vpgm starts at an initial voltage, and incrementally increases with each program loop until the data is programmed. For example, the program voltage may vary from 15-20V. This will be described in greater detail below. A low voltage, such as 0V may also be applied to the common source line CSL.

During an example programming operation, program data loaded in the read/write circuit 320 may be written into selected memory cells MCs in the unit of a page. In programming the cell array 310 formed of multi-level cells (MLCs), data may be written (e.g., sequentially written) in the unit of two pages to reduce coupling effects between adjacent cells and/or enhance boosting efficiency. As discussed above, the read/write circuit 320 may include a plurality or pluralities of page buffer units and each page buffer unit may correspond to at least one bit line of the cell array 310. Under the control of the control logic 350, the read/write circuit 320 functions as a write driver during a program operation. Each page buffer unit may be electrically coupled to a bit line or one bit line of a bit line pair, and may be configured to store data bits for program to the cell array 310 through the bit line. Each page buffer unit may include a first latch and a second latch for handling multi-bit programming. Because the structure and operation of page buffers for MLC programming is so well-known, this will not be described in detail for the sake of brevity.

The read/write circuit 320 transfers program data to the cell array 310 from the data input/output circuit 330 based on the column address received from the control logic 350. During a programming operation, the data input/output circuit 330 may store (e.g., temporarily store) externally input program data.

After each program attempt during a program loop, the control logic 350 controls the row decoder 340 and the read/write circuit 320 to perform a read operation on the programmed memory cells. The read operation is the same as described above. However, during this read operation, the control logic 350 controls the data input/output circuit 330 such that the data input/output circuit 330 does not output the read data. Instead, the control logic 350 determines if the read data matches the program data. If not, the control logic 350 proceeds to the next program loop with an incremented program voltage Vpgm.

During an erase operation, the control logic 350 controls the row decoder 340 to apply voltages to the string selection lines SSL1 and SSL2, the word lines WLs, the ground selection lines GSL1 and GSL2, and the substrate or bulk to erase selected memory cells. In one embodiment, the memory cells MCs are erased on a block basis. For example, the portion of the cell array 310 shown in FIG. 1 may be a single block 315, and the cell array 310 may include multiple such blocks. Furthermore, the control logic 350 includes an erase controller 352 that particularly controls the voltages applied to the first string selection line SSL1 and the first ground selection line GSL1. The erase operation will be described in more detail below with respect to FIG. 2.

Figure 2:
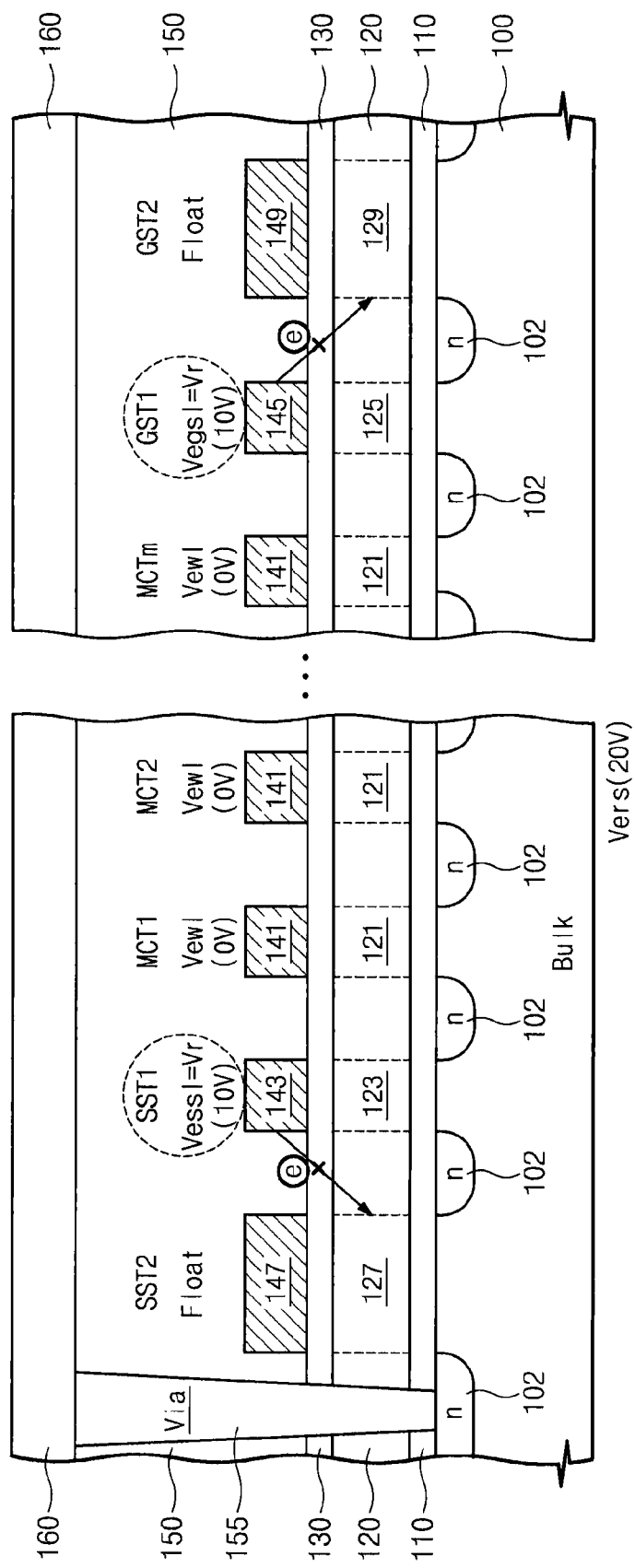
FIG. 2 illustrates a cross-section of a string in FIG. 1 as well as voltages applied to the transistors in the string during an erase operation according to an embodiment.

FIG. 2 illustrates a cross-section of a string in FIG. 1 as well as voltages applied to the transistors in the string during an erase operation according to an embodiment. As shown, the memory cell array 310 includes a substrate 100 (or a bulk region 100 formed in the substrate). The memory cell transistors MCT have a structure that includes a charge storage area 121 formed in a charge storage layer 120, which is insulated from the substrate 100 by a first insulation layer 110. The charge storage layer 120 may include nitrogen (e.g., may be a nitride layer) and the first insulation layer 110 may be an oxide layer. A second insulation layer 130 is formed over the charge storage layer 120, and a control gate 141 for each memory cell transistor MCT is formed on the second insulation layer 130 over a corresponding charge storage area 121. It will be appreciated that the control gate 141 defines the corresponding charge storage area 121. The second insulation layer 130 may be an oxide layer (e.g., may be the same oxide as the first insulation layer 110) and the control gates 141 may be formed by patterning a conductive material (e.g., metal, metal alloy, polysilicon, etc.). As will be appreciated each control gate 141 may be part of a word line WL running along a first direction (into and out of the figure). Still further, impurity regions 102 are formed in the substrate 100 on either side of a corresponding control gate 141. The impurity regions 102 may be N-type impurity regions, and may be formed by ion implantation.

As discussed above, the first string selection transistor SST1 and the first gate selection transistor GST1 may be dummy memory cell transistors MCT. As such, these transistors have the same structure as the memory cell transistors MCT, albeit (1) the charge storage areas have been labeled 123 and 125, respectively, and (2) the control gates have been labeled 143 and 145, respectively. Also, the control gates 143 and 145 may be part of a first string selection line SSL1 and a first ground selection line GSL1 running along the first direction (into and out of the figure).

Still referring to FIG. 2, the second string selection transistor SST2 and the second gate selection transistor GST2 have the same structure as a memory cell transistor MCT, except that the second string selection transistor SST2 and the second gate selection transistor GST2 are larger transistors. As shown, the control gate 147 and corresponding charge storage area 127 of the second string selection transistor SST2 is larger (e.g., wider) than for a memory cell transistor MCT. Similarly, the control gate 149 and corresponding charge storage area 129 of the second ground selection transistor GST2 is larger (e.g., wider) than for a memory cell transistor MCT. N-type impurity regions are formed on either side of the second string selection transistor SST2 and the second gate selection transistor GST2. Also, the control gates 147 and 149 may be part of a second string selection line SSL2 and a second ground selection line GSL2 running along the first direction (into and out of the figure).

The resulting structure is covered by a protection layer 150. The protection layer 150 may be a resin. A bit line 160 is formed over the protection layer 150, and a via 155 connects the bit line 160 to the impurity region 102 of the second string selection transistor SST2 on the exterior side of the string 110. The bit line may a conductive material (e.g., metal, metal alloy, polysilicon, etc.) and the bit line 160 may cross the word lines WLs, for example, may run perpendicular to the word lines WLs. While not shown, the impurity region 102 of the second ground selection transistor GST2 on the exterior side of the string 110 is connected to the common source line CSL.

As will be appreciated, first and second string selection transistors SST1 and SST2, the memory cell transistors MCTs, and the first and second ground selection transistors GST1 and GST2 are programmable transistors of the floating gate type.

During an erase operation, the control logic 350 controls the row decoder 340 to apply voltages to the control gates 141 of the memory cell transistors MCTs, the control gate 143 of the first string selection transistor SST1, the control gate 145 of the first ground selection transistor GST1, the control gate 147 of the second string selection transistor SST2 and the control gate 149 of the second ground selection transistor GST2. In particular, and as described in detail below, the erase controller 352 controls the voltages that the SSL driver 342 and the GSL driver 344 respectively apply to the control gates 143 and 145 of the first string and ground selection transistors SST1 and GST1.

As shown in FIG. 2, the row decoder 340 applies a low voltage (e.g., zero volts) as the erase word line voltage Vewl to the control gates 141 of the memory cell transistors MCT. The row decoder 340 also applies a high voltage (e.g., 20 volts) as the erase voltage Vers to the substrate or bulk 100. No voltage is applied to the control gates 147 and 149 of the second string and ground selection transistors SST2 and GST2 by the SSL driver 342 and the GSL driver 344. Accordingly, the control gates 147 and 149 float.

The SSL driver 342 applies a first restriction voltage as the string selection voltage Vessl to the control gate 143 of the first or dummy string selection transistor SST1. The GSL driver 344 applies a second restriction voltage as the ground selection voltage Vegsl to the control gate 145 of the first or dummy ground selection transistor GST1. The first and second restriction voltages may be the same. The timing and/or voltage level of the first and second restriction voltage is controlled by the erase controller 352 as described in more detail below. The first and second restriction voltages are greater than the low voltage applied as the erase word line voltage Vewl and less than the erase voltage Vers. In this embodiment the first and second restrictions voltages are greater than zero and less than 20V. For example, in the embodiment of FIG. 2, the first and second restriction voltages are set to 10V. Because the control gates 143 and 145 do not float, and have a voltage greater than the erase word line voltage Vewl, this respectively prevents electrons from being injected into the charge storage areas 127 and 129 of the second string and ground selection transistors SST2 and GST2. Stated another way, application of the first and second restriction voltages respectively restricts electrons from flowing from the first string and ground selection transistors SST1 and GST1, which are dummy transistors, to the second string and ground selection transistors SST2 and GST2. Depending on the voltages chosen, the restriction may block the electrons from flowing to the second string and ground selection transistors SST2 and GST2. By contrast, if the control gates 143 and 145 were allowed to float, then electrons flow would flow unrestricted into the second string and ground selection transistors SST2 and GST2, and adversely increase the threshold voltages of these transistors.

The first and second restriction voltages may be set such that a voltage difference between the restriction voltages and the erase voltage Vers is kept below a maximum difference amount. This maximum difference amount may be set to prevent the first string and ground selection transistors SST1 and GST1 from becoming programmed.

Figure 3:
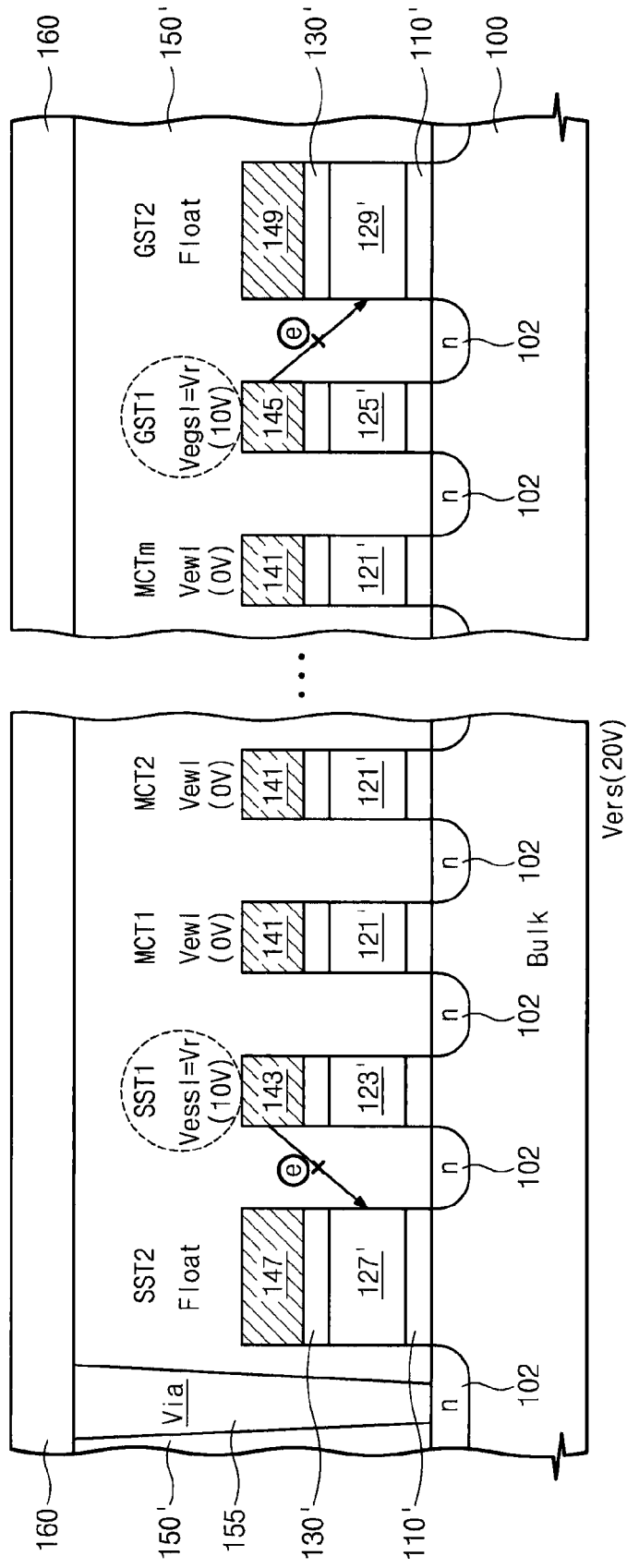
FIG. 3 illustrates a cross-section of a string in FIG. 1 as well as voltages applied to the transistors in the string during an erase operation according to another embodiment.

FIG. 3 illustrates a cross-section of a string in FIG. 1 as well as voltages applied to the transistors in the string during an erase operation according to another embodiment. The embodiment of FIG. 3 is the same as the embodiment of FIG. 2 except that the structure of the transistors differs. While the transistors in FIG. 2 were of the floating gate type, the transistors in FIG. 3 are the charge trap flash (CTF) type. Namely, in this embodiment, the first insulation layer 110, the charge storage layer 120 and the second insulation layer 130 over the impurity regions 102 is removed to form: (1) for the memory cell transistors MCTs, a first insulator 110', a charge trap area 121', and second insulator 130' under the control gates 141; (2) for the first string selection transistor SST1, the first insulator 110', a charge trap area 123', and the second insulator 130' under the control gate 143; (3) for the first ground selection transistor GST1, the first insulator 110', a charge trap area 125', and the second insulator 130' under the control gate 145; (4) for the second string selection transistor SST2, the first insulator 110', a charge trap area 127', and the second insulator 130' under the control gate 147; (5) for the second ground selection transistor GST2, the first insulator 110', a charge trap area 123', and the second insulator 130' under the control gate 149.

The protection layer 150' is then formed to cover the resulting structure, and fills the spaces between the transistors over the impurity regions 102.

As to operation, the operation is the same as described with respect to FIG. 2 such that application of the first and second restriction voltages respectively restricts electrons from flowing from the first string and ground selection transistors SST1 and GST1, which are dummy transistors, to the second string and ground selection transistors SST2 and GST2.

Next, operation of the erase controller 352 to control the timing for applying the restriction voltages will be described with respect to FIGS. 4A and 4B. For the sake of brevity, a single restriction voltage will be described, but it will be understood that this description applies independently to the first and second restriction voltages.

Figure 4A:
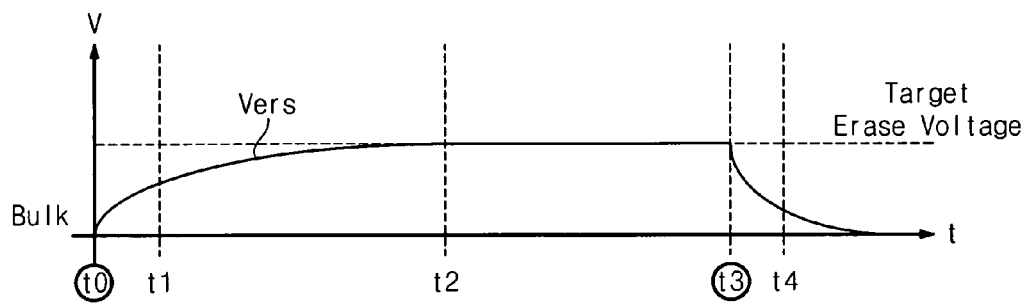
FIG. 4A illustrates a timing diagram of the erase applied to the substrate or bulk in FIGS. 2 and 3.

FIG. 4A illustrates a timing diagram of the erase voltage Vers applied to the substrate or bulk in FIGS. 2 and 3. As shown, application of erase voltage Vers starts at time t0, but only after a period of time does the erase voltage Vers reach the desired target erase voltage level at time t2. If the restriction voltage Vr was applied to the dummy or first string and ground selection transistors SST1 and GST1, and this restriction voltage Vr was not lower than the erase voltage Vers by certain amount, the first string and ground selection transistors SST1 and GST1 could be inadvertently programmed.

Figure 4B:
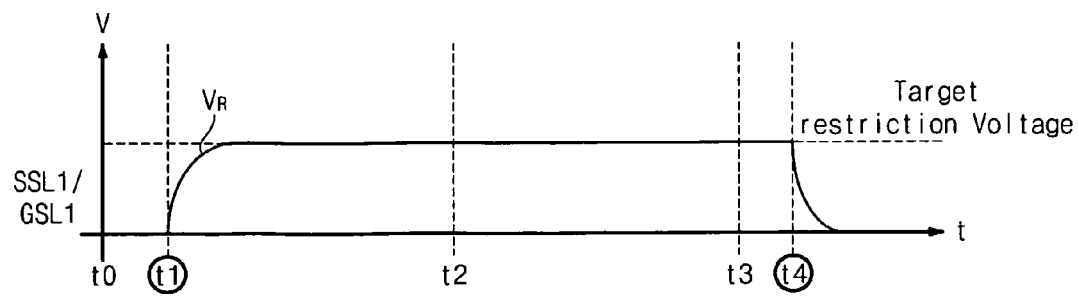
FIG. 4B illustrates a timing diagram of the restriction voltage applied to the first string and/or ground selection transistors.

FIG. 4B illustrates a timing diagram of the restriction voltage Vr applied to the first string and/or ground selection transistors. As shown, application of the restriction voltage Vr begins at a time t1 later than time t0, and that the restriction voltage achieves a target restriction voltage over time. Namely, the restriction voltage Vr is applied some time after the erase voltage Vers is applied. This insures that a large enough difference exists between the restriction voltage Vr and the erase voltage Vers to prevent the first string and/or ground selection transistors SST1 and GST1 from being programmed.

Figure 5:
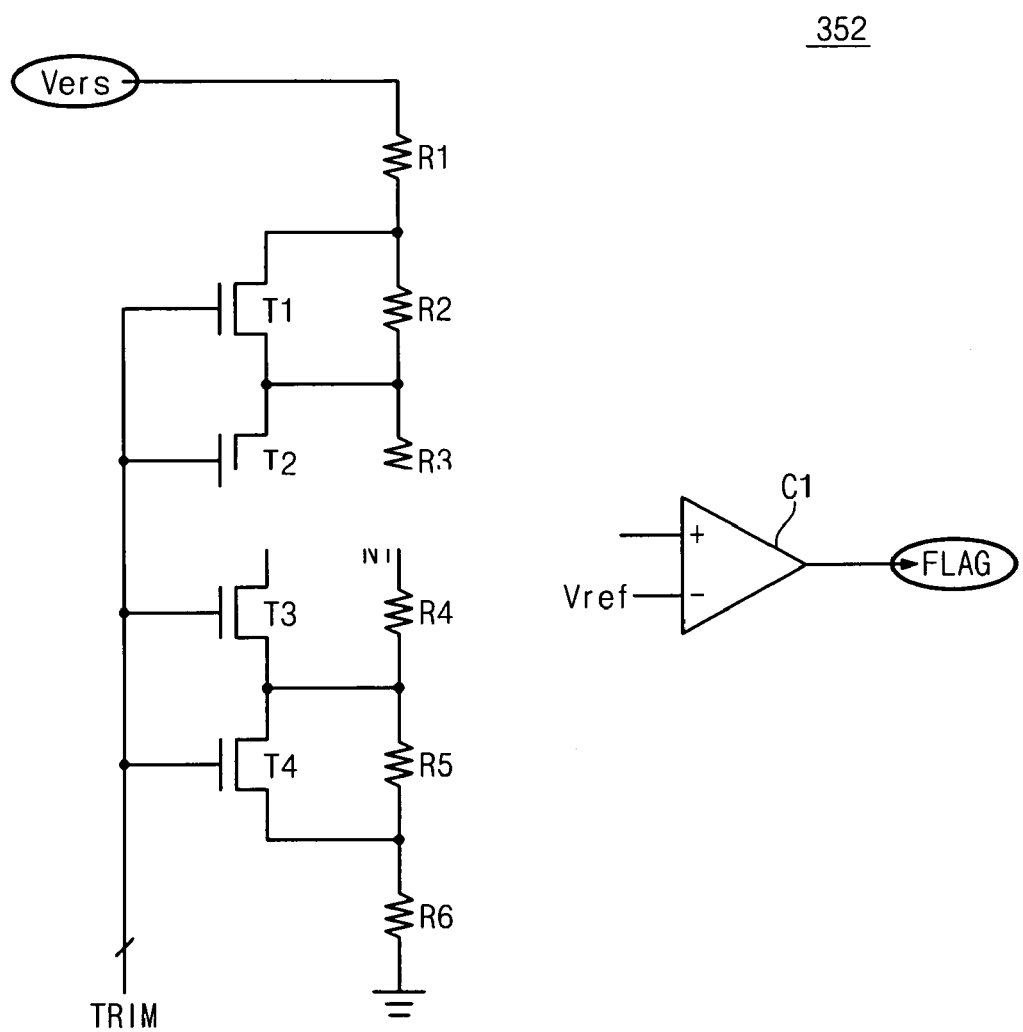
FIG. 5 illustrates an embodiment of the erase controller of FIG. 1 for controlling the timing for applying the restriction voltage as discussed with respect to FIGS. 4A and 4B.

FIG. 5 illustrates an embodiment of the erase controller of FIG. 1 for controlling the timing for applying the restriction voltage as discussed with respect to FIGS. 4A and 4B. As shown, the erase controller 352 includes six resistors R1-R6 connected in series between ground and the erase voltage Vers being applied to the word lines WL during an erase operation. First-fourth transistors T1-T4 are respectively connected in parallel to the second-fifth resistors R2-R5. The first-fourth transistors T1-T4 receive a trim voltage at their gates. The resistors R1-T6 and the transistors T1-T4 operate as a voltage divider and generate a divided voltage Vn at the node N1 connecting third and fourth resistors R3 and R4. The divided voltage Vn is supplied to a positive terminal of a differential amplifier C1 and compared to a reference voltage Vref, which is supplied to a negative terminal of the differential amplifier C1. The differential amplifier C1 outputs a flag based on the comparison. If the divided voltage Vn is less than the reference voltage Vref, the comparator C1 outputs a logic low flag. If the divided voltage Vn is equal to or greater than the reference voltage Vref, the differential amplifier C1 outputs a logic high flag. When the SSL driver 342 and/or GSL driver 344 receive the transition to the logic high flag, the SSL driver 342 and/or GSL driver 344 begin to apply the restriction voltage Vr.

The trim voltage and the reference voltage Vref are set to insure that a large enough difference exists between the restriction voltage Vr and the erase voltage Vers to prevent the first string and/or ground selection transistors SST1 and GST1 from being programmed. As will be appreciated, the reference voltage Vref and the trim voltage are design parameters that will vary based on the design of the non-volatile semiconductor memory device.

As will also be appreciated, when the application of the erase voltage Vers terminates, the divided voltage Vn will fall back below the reference voltage. When this happens, the flag output from differential amplifier C1 transitions to logic low. As a result, the SSL driver 342 and/or GSL driver 344 will cease applying the restriction voltage Vr. This is shown in FIGS. 4A and 4B.

As discussed above, the SSL driver 342 and the GSL driver 344 may supply independent first and second restriction voltages. In this case, the erase controller 352 may include two versions of the structure of FIG. 5 for respectively triggering the generating of the first and second restriction voltages, or alternatively, the first and second restriction voltages may be triggers by the same output (i.e., a single FIG. 5 structure).

Instead of insuring the desired difference between the restriction voltage Vr and the erase voltage Vers by controlling the timing for applying the restriction voltage Vr, the erase controller 352 may control the voltage of the restriction voltage Vr.

Next, operation of the erase controller 352 to control the level of the restriction voltage will be described with respect to FIGS. 6A and 6B. For the sake of brevity, a single restriction voltage will be described, but it will be understood that this description applies independently to the first and second restriction voltages.

Figure 6A:
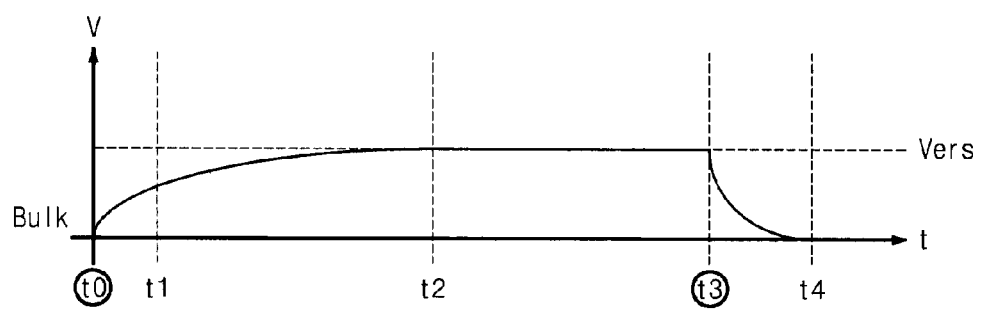
FIG. 6A illustrates a timing diagram of the erase voltage applied to the substrate or bulk in FIGS. 2 and 3.
Figure 6B:
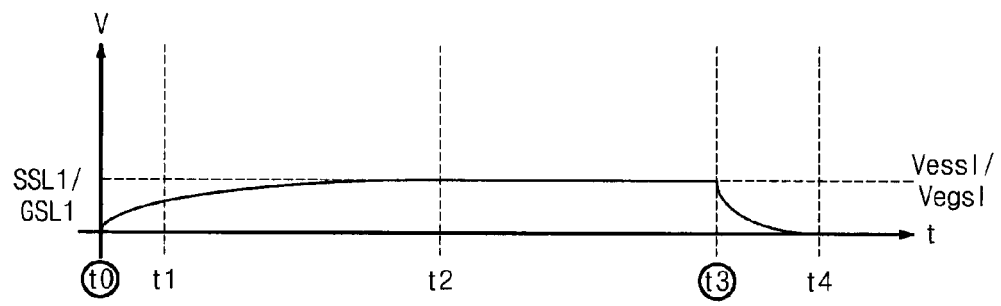
FIG. 6B illustrates a timing diagram of the restriction voltage applied to the first string and/or ground selection transistors.

FIG. 6A is the same as FIG. 4A, but has been reproduced in association with FIG. 6B so that the relationship between the erase voltage Vers and the restriction voltage Vr may be more easily understood. FIG. 6B illustrates a timing diagram of the restriction voltage Vr applied to the first string and/or ground selection transistors SST1 and GST1. As shown, application of the restriction voltage Vr begins at a time t0, and that the restriction voltage achieves a target restriction voltage over time. As also shown, the restriction voltage Vr is proportional to the erase voltage Vers, with the proportion being less than one. Properly setting the proportion insures that a large enough difference exists between the restriction voltage Vr and the erase voltage Vers to prevent the first string and/or ground selection transistors SST1 and GST1 from being programmed.

Figure 7:
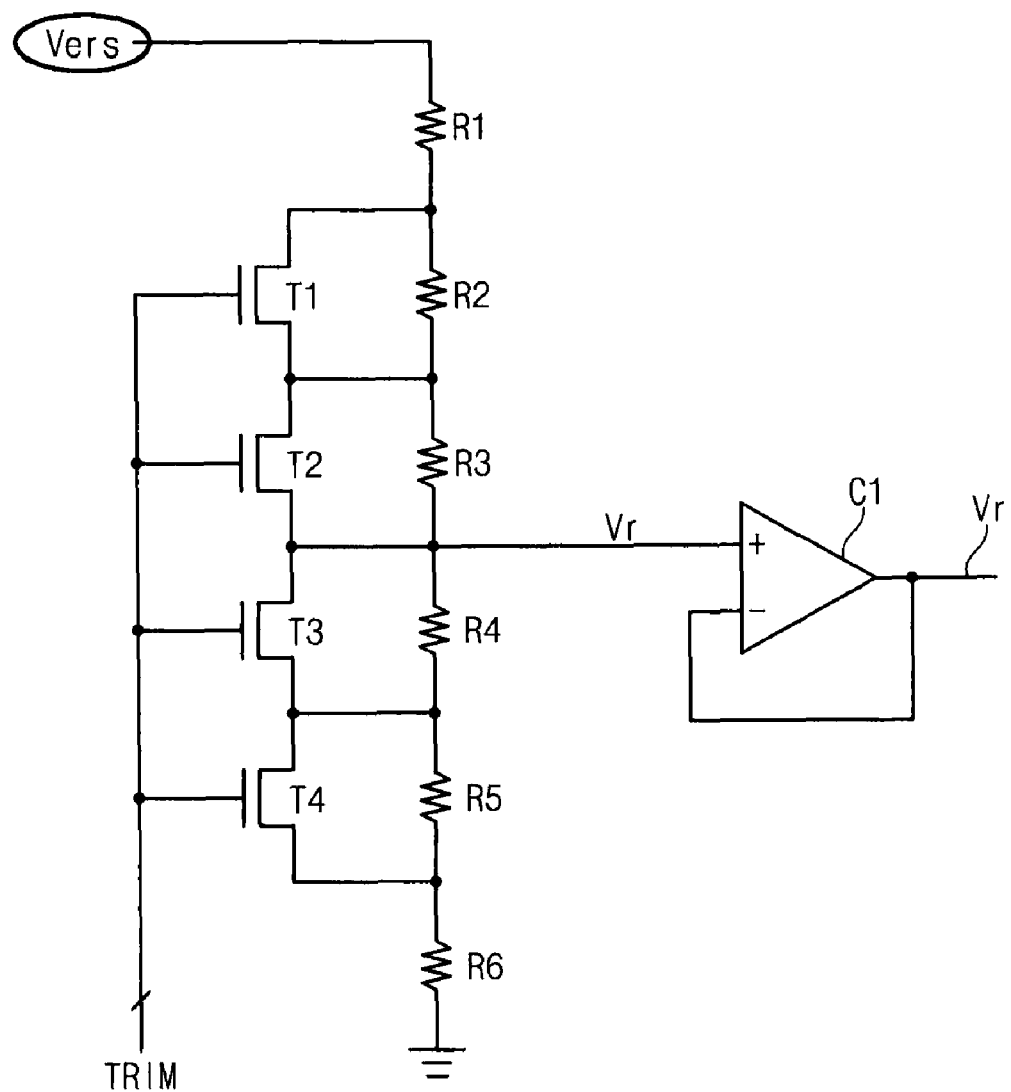
FIG. 7 illustrates an embodiment of the erase controller of FIG. 1 for controlling the restriction voltage as a proportion of the erase voltage as discussed with respect to FIGS. 6A and 6B.

FIG. 7 illustrates an embodiment of the erase controller of FIG. 1 for controlling the restriction voltage as a proportion of the erase voltage as discussed with respect to FIGS. 6A and 6B. As shown, the embodiment of FIG. 7 is the same as the embodiment of FIG. 5, except that the divided voltage Vn is compared to the output of the differential amplifier C1 and the output of the differential amplifier C1 is the restriction voltage Vr. As discussed above, the SSL driver 342 and the GSL driver 344 may supply independent first and second restriction voltages. In this case, the erase controller 342 may include two versions of the structure of FIG. 7 for respectively generating the first and second restriction voltages.

Figure 8:
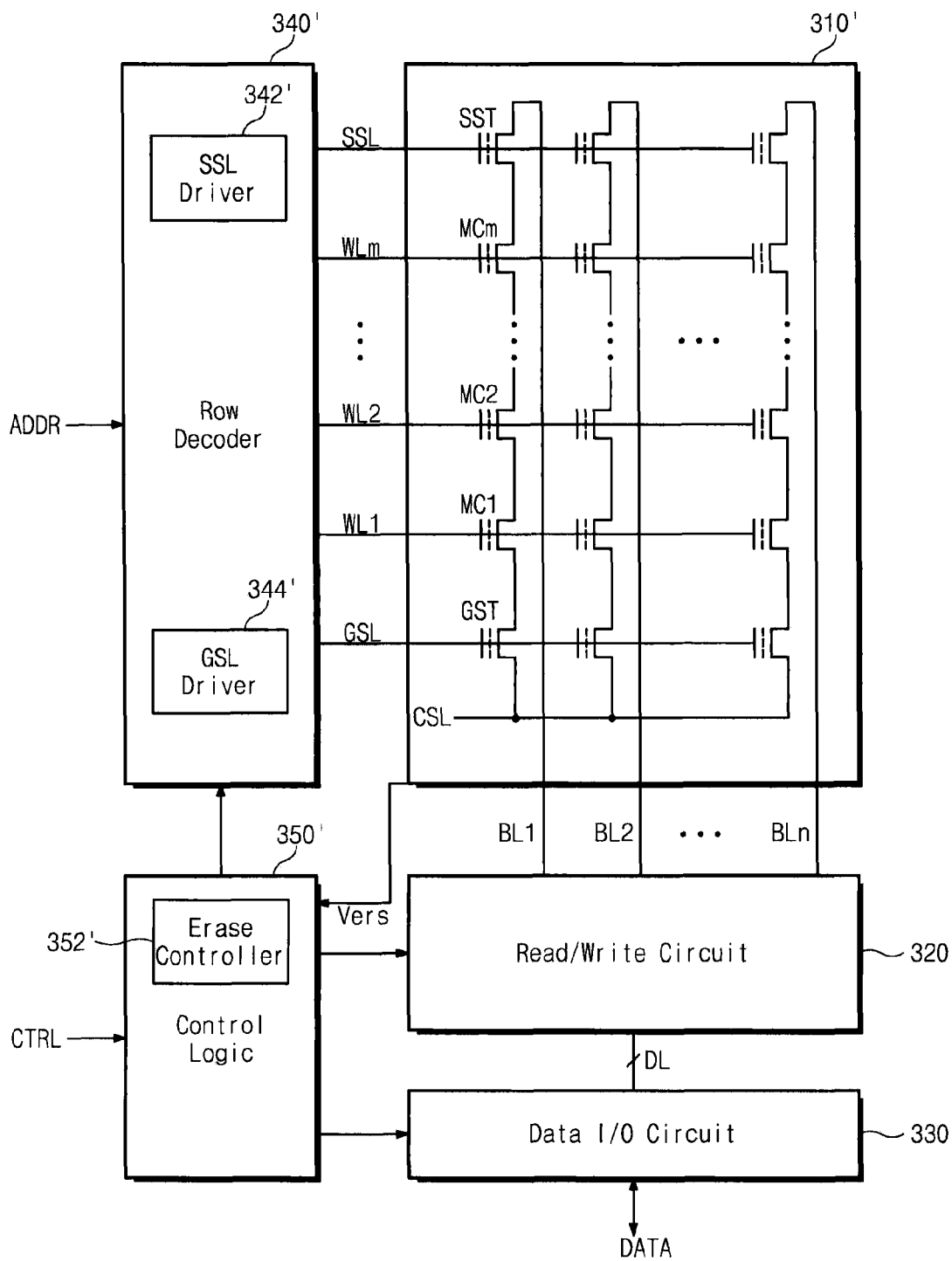
FIG. 8 is a block diagram illustrating a non-volatile memory device according to another example embodiment.

FIG. 8 is a block diagram illustrating a non-volatile memory device according to another example embodiment. The embodiment of FIG. 8 is the same as the embodiment of FIG. 1, except that the dummy string selection transistor SST1 and dummy ground selection transistor GST1 (and associated selection lines) have been eliminated from the cell array 310' in FIG. 8 and the second string and ground selection transistors SST2 and GST2 have been re-labeled as string and ground selection transistors SST and GST, respectively. As such, the SSL driver 342' drives the string selection line SSL, the GSL driver 344' drives the ground selection line GSL, and the erase controller 352' controls the SSL driver 342' and the GSL driver 344'. In particular, the erase controller 352' controls the SSL driver 342' and the GSL drive 344' to apply first and second restriction voltages, respectively, to the string and ground selection transistors SST and GST in the cell array 310' in the same manner as described above with respect to applying restriction voltages to the dummy string and ground selection transistors SST1 and GST1 in the embodiment of FIG. 1. This will be described in more detail below with respect to FIGS. 9 and 10.

Figure 9:
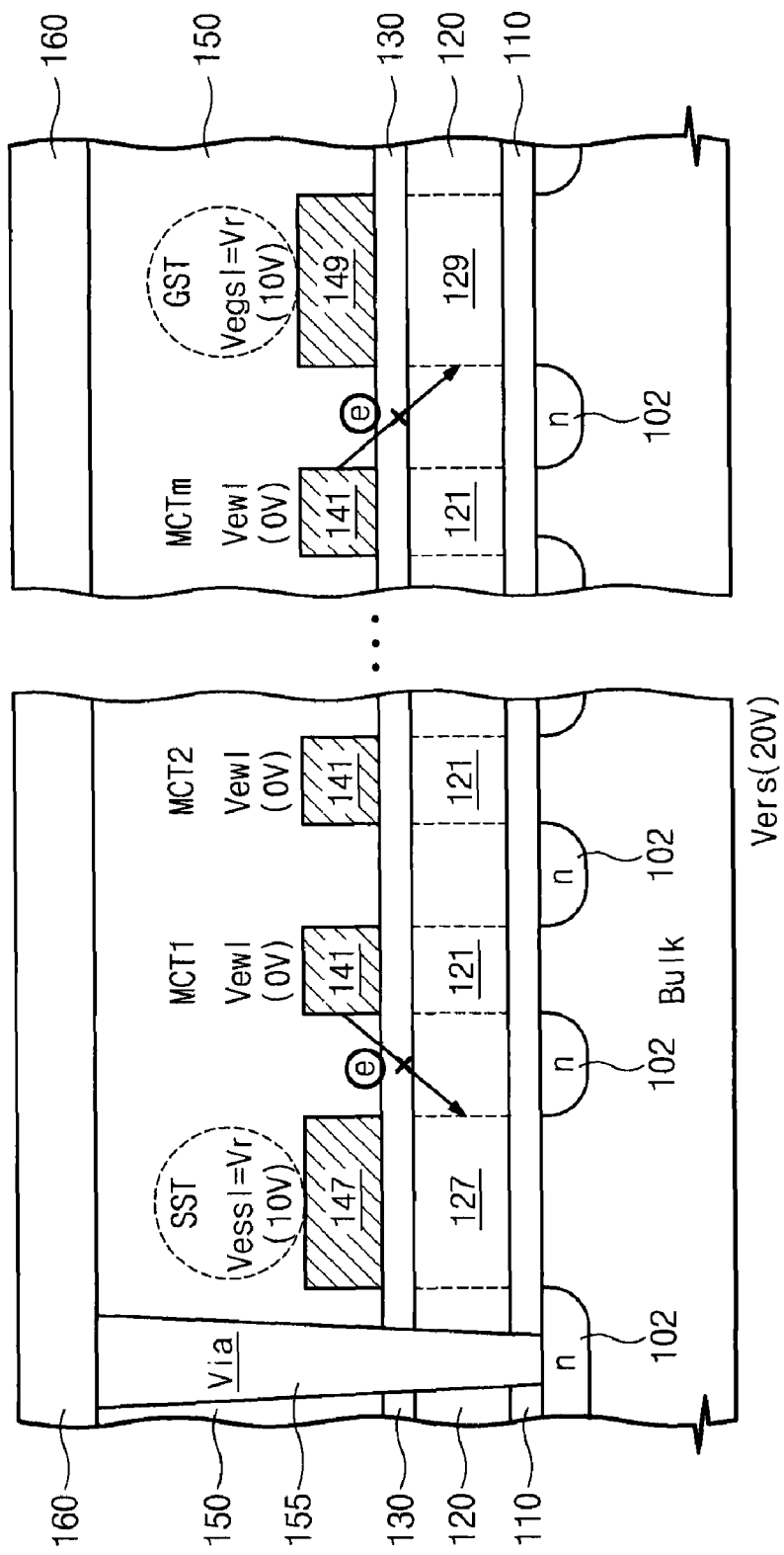
FIG. 9 illustrates a cross-section of a string in FIG. 8 as well as voltages applied to the transistors in the string during an erase operation according to an embodiment.

FIG. 9 illustrates a cross-section of a string in FIG. 8 as well as voltages applied to the transistors in the string during an erase operation according to an embodiment. The embodiment of FIG. 9 is the same as the embodiment of FIG. 2 except that the dummy string and ground selection transistors SST1 and GST1 have been eliminated, and the restriction voltage Vr is applied to the control gates 147 and 149 of the string and ground selection transistors SST and GST.

The application of the restriction voltage Vr restricts the flow of electrons from the adjacent memory cell transistor MCT into the string and ground selection transistors SST and GST. Furthermore, if the restriction voltage Vr is set high enough, the flow of electrons may be blocked.

Figure 10:
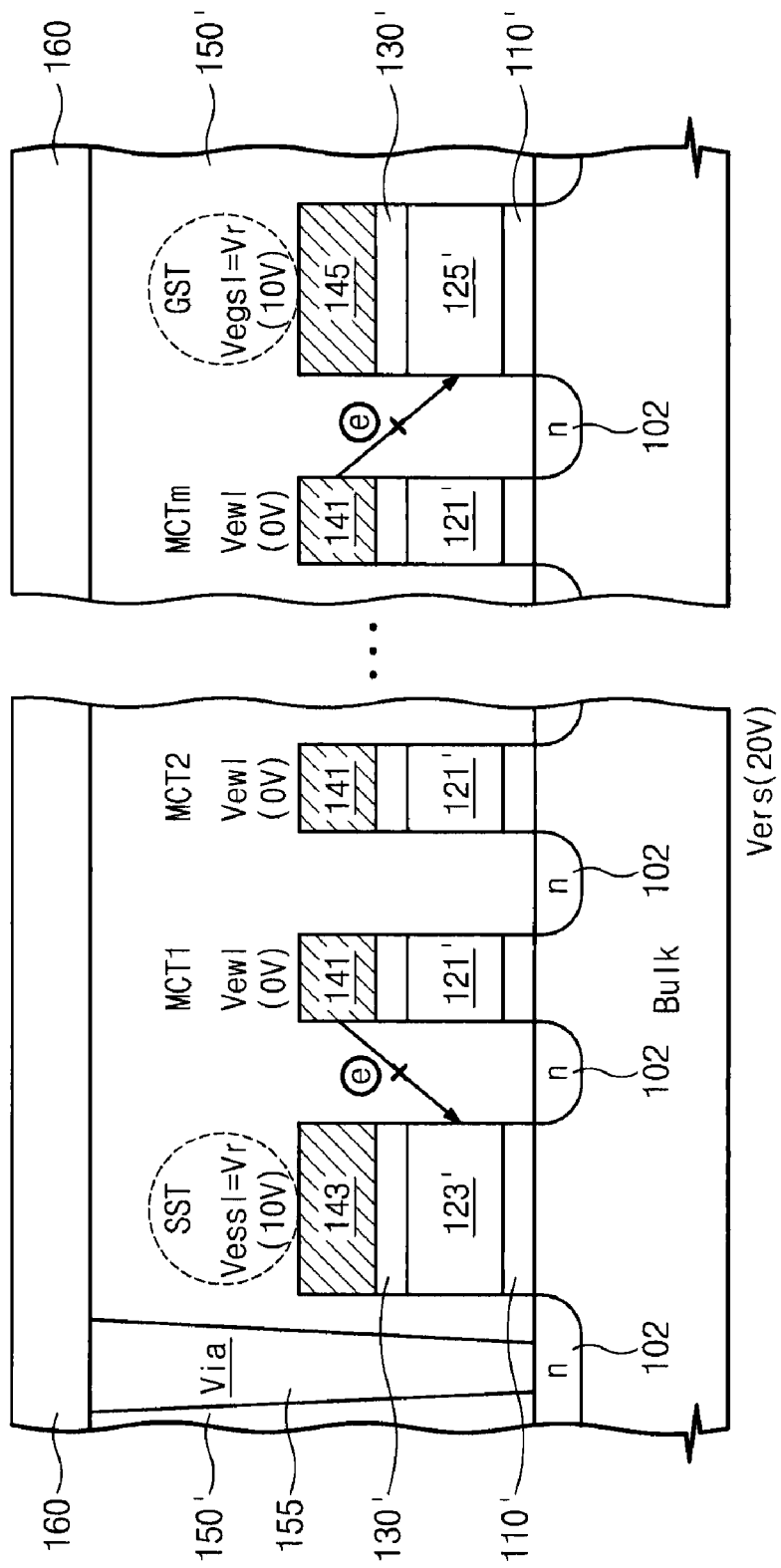
FIG. 10 illustrates a cross-section of a string in FIG. 8 as well as voltages applied to the transistors in the string during an erase operation according to another embodiment.

FIG. 10 illustrates a cross-section of a string in FIG. 8 as well as voltages applied to the transistors in the string during an erase operation according to another embodiment. The embodiment of FIG. 10 is the same as the embodiment of FIG. 3 except that the dummy string and ground selection transistors SST1 and GST1 have been eliminated, and the restriction voltage Vr is applied to the control gates 147 and 149 of the string and ground selection transistors SST and GST.

As to operation, the operation is the same as described with respect to FIG. 9 such that application of the first and second restriction voltages respectively restrict electrons from flowing from adjacent memory cell transistors MCT to the string and ground selection transistors SST and GST.

It will also be understood that either of the erase controller embodiments of FIGS. 5 and 7 may be used in conjunction with the embodiments of FIGS. 8-10 to control the restriction voltage Vr.

FIGS. 11-18 illustrate implementation embodiments.

Figure 11:
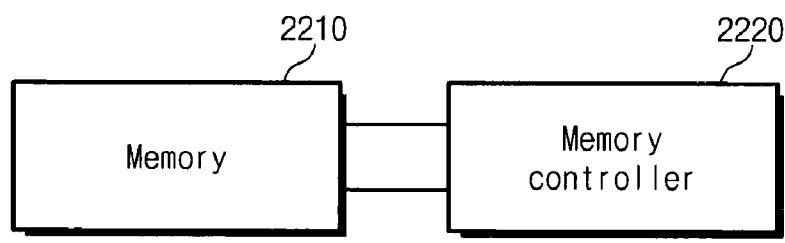
FIGS. 11-18 illustrate example embodiments of applications of the semiconductor device.

FIG. 11 illustrates an example embodiment of an application of the non-volatile memory device. As shown, this embodiment includes a memory 2210 connected to a memory controller 2220. The memory 2210 may be any non-volatile memory device according to one of the above-described embodiments. The memory controller 2220 supplies the input signals for controlling operation of the memory 2210. For example, the memory controller 2220 supplies the command and address information.

Figure 12:
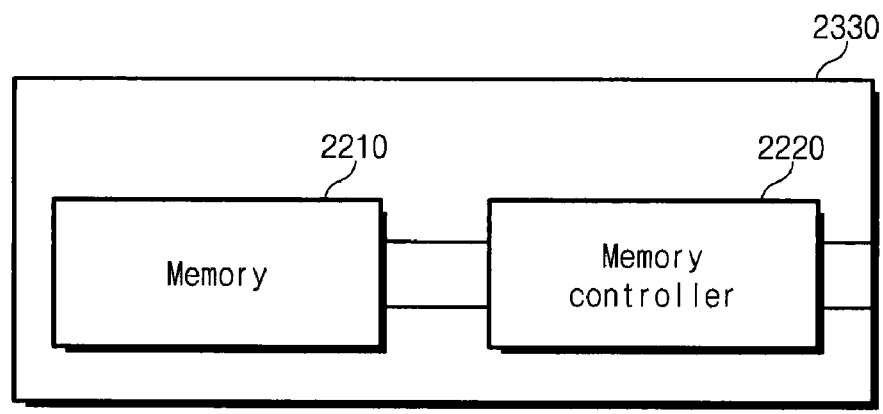

FIG. 12 illustrates yet another embodiment. This embodiment is the same as the embodiment of FIG. 11, except that the memory 2210 and memory controller 2220 have been embodied as a card 2330. For example, the card 2330 may be a memory card such as a flash memory card. Namely, the card 2330 may be a card meeting any industry standard for use with a consumer electronics device such as a digital camera, personal computer, etc. It will be appreciated that the memory controller 2220 may control the memory 2210 based on controls signals received by the card 2330 from another (e.g., external) device.

Figure 13:
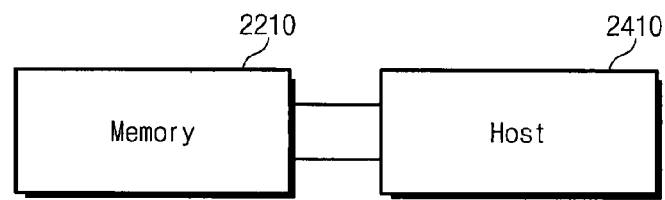

FIG. 13 illustrates a still further implementation embodiment. As shown, the memory 2210 may be connected with a host system 2410. The host system 2410 may be a processing system such as a personal computer, digital camera, etc. The host system 2410 may use the memory 2210 as a removable storage medium. As will be appreciated, the host system 2410 supplies the input signals for controlling operation of the memory 2210. For example, the host system 2410 supplies the command and address information.

Figure 14:
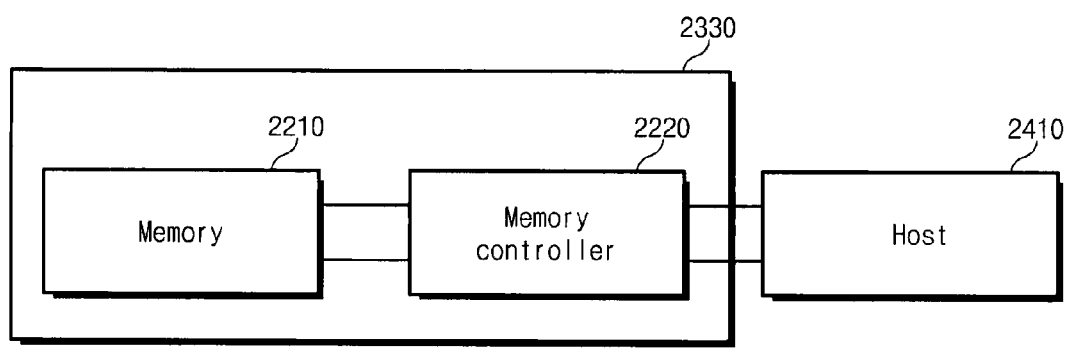

FIG. 14 illustrates an embodiment in which the host system 2410 is connected to the card 2330 of FIG. 12. In this embodiment, the host system 2410 applies control signals to the card 2330 such that the memory controller 2220 controls operation of the memory 2210.

Figure 15:
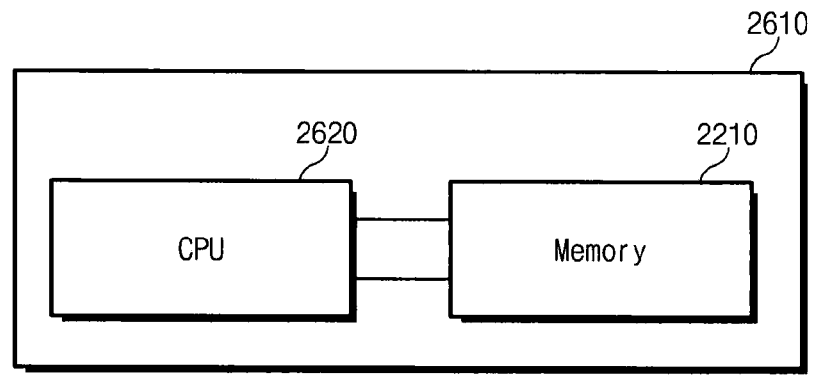

FIG. 15 illustrates a further implementation embodiment. As shown, the memory 2210 may be connected to a central processing unit (CPU) 2620 within a computer system 2610. For example, the computer system 2610 may be a personal computer, personal data assistant, etc. The memory 2210 may be directly connected with the CPU 2620, connected via bus, etc. It will be appreciated, that FIG. 15 does not illustrate the full complement of components that may be included within a computer system 2610 for the sake of clarity.

Figure 16:
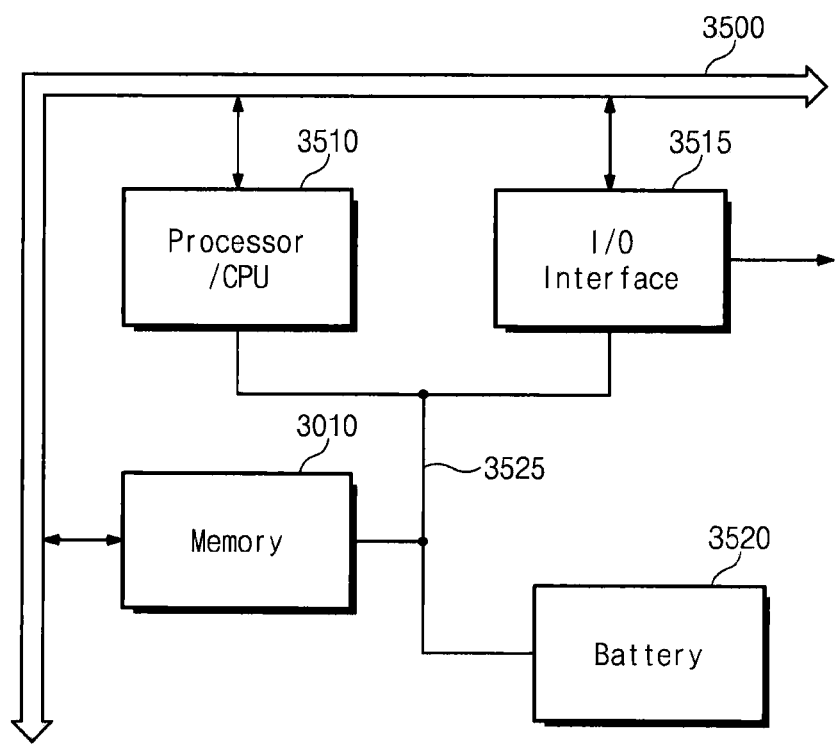

FIG. 16 illustrates another embodiment of the present invention. FIG. 16 may represent another portable application of the semiconductor device embodiments described above. As shown, this embodiment includes the memory 3010, which may be any of the non-volatile memory device embodiments described above. In this and any of the previous embodiments, the memory 3010 may include one or more integrated circuit dies where each die has a memory array that operates according to the various embodiments. These IC dies may be separate, stand alone memory devices that are arranged in modules such as conventional dynamic random access memory (DRAM) modules, or they may be integrated with other on-chip functionalities. In the latter embodiments, the memory 3010 may be part of an I/O processor or a microcontroller as described above.

This and the other portable application embodiments may be for instance a portable notebook computer, a digital still and/or video camera, a personal digital assistant, a mobile (cellular) hand-held telephone unit, navigation device, GPS system, audio and/or video player, etc. Of course, there are other non-portable applications for the memory 3010. These include, for instance, large network servers or other computing devices which may benefit from a non-volatile memory device.

As shown in FIG. 16, this embodiment includes a processor or CPU 3510 that uses the memory 3010 as program memory to store code and data for its execution. Alternatively, the memory 3010 may be used as a mass storage device for non-volatile storage of code and data. The portable application embodiment may communicate with other devices, such as a personal computer or a network of computers via an I/O interface 3515. This I/O interface 3515 may provide access to a computer peripheral bus, a high speed digital communication transmission line, or an antenna for unguided transmissions. Communications between the processor and the memory 3010 and between the processor 3510 and the I/O interface 3515 may be accomplished using conventional computer bus architectures as represented by bus 3500 in FIG. 16. Furthermore, the present invention is not limited to this architecture. For example, the memory 3010 may be replaced with the embodiment of FIG. 12, and communication with the processor 3510 may be via the memory controller 2220. Furthermore, the I/O interface 3515 may communicate with the memory 3010 via the memory controller 2220, or directly with the memory 3010 if the memory controller 3020 is not present. In portable applications, the above-described components are powered by a battery 3520 via a power supply bus 3525.

Figure 17:
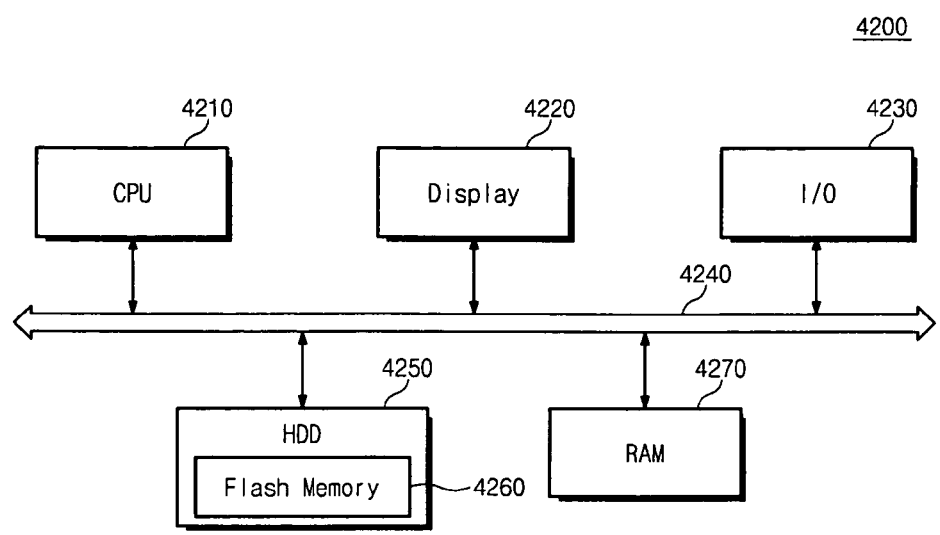

FIG. 17 is a block diagram showing an example apparatus (e.g., a mobile apparatus) employing a flash memory device, according to an example embodiment. The flash memory device 4260 may be any of the above-described non-volatile memory device embodiments, and may be used for larger or relatively large capacity storage units.

Referring to FIG. 17, the flash memory device 4260 may be used in or adapted to be used in a hard disk 4250 of a mobile apparatus 4200. The flash memory device 4260 may be usable as a larger or relatively large capacity storage unit of the hard disk 4250. For example, the flash memory device 4260 may be provided for a solid state disk and/or the flash memory device 4260 may be usable as a flash memory component in a hybrid hard disk. In the mobile apparatus 4200, data supplied from the hard disk 4250 may be transferred to a RAM 4270 or a central processing unit (CPU) 4210 via a bus 4240. Data stored in the RAM 4270 and internally generated by the CPU 4210 in response to an operation of an input/output unit 4230 may be stored in the hard disk 4250 via the bus 4240.

Figure 18:
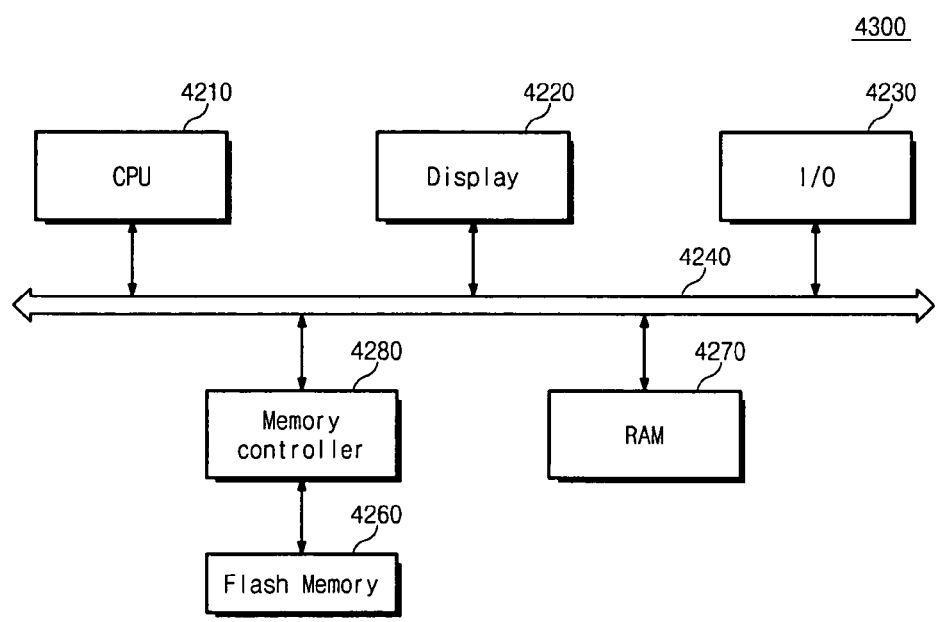

FIG. 18 is a block diagram showing another example apparatus (e.g., mobile apparatus) employing a flash memory device, according to an example embodiment. Referring to FIG. 18, the flash memory device 4260 may be used as a nonvolatile memory component in an apparatus 4300 and may be according to any of the above-described non-volatile memory device embodiments. The apparatus 4300 may be a mobile apparatus; however, it is not restricted thereto. In this example, the mobile apparatus 4300 may include a memory controller 4280 configured to perform an interface operation for data exchange. The memory controller 4280 may perform a data input/output operation through the bus 4240 of the mobile apparatus 4300.

Example embodiments are to be considered illustrative, but not restrictive, and the appended claims are intended to cover all such modifications, enhancements, and other embodiments, which fall within the true spirit and scope of the present invention. For example, while described with respect to MLC memory cells, the embodiments equally apply to single level (SLC) memory cells. Thus, to the maximum extent allowed by law, the scope of the present invention is to be determined by the broadest permissible interpretation of the following claims and their equivalents, and shall not be restricted or limited by the foregoing detailed description.

What is claimed is:

1. An erase method for a memory including a memory array having at least first and second programmable transistors connected in series, comprising:
   restricting flow of electrons from the first programmable transistor into the second programmable transistor during an erase operation.

2. The method of claim 1, wherein the restricting applies a first voltage to a control gate of the first programmable transistor.

3. The method of claim 2, further comprising:
   applying a second voltage to at least a portion of the substrate including the first and second programmable transistors.

4. The method of claim 3, further comprising:
   applying a third voltage to a gate of at least one programmable memory cell transistor associated with the first and second programmable transistors such that the memory cell transistor obtains an erased state.

5. The method of claim 4, wherein the first voltage is greater than the third voltage and less than the second voltage.

6. The method of claim 5, further comprising:
   allowing a gate of the second programmable transistor to float.

7. The method of claim 5, wherein the restricting applies the first voltage based on the second voltage.

8. The method of claim 7, wherein the restricting applies the first voltage a period of time after application of the second voltage.

9. The method of claim 7, wherein the restricting applies the first voltage such that the first voltage is proportional to the second voltage.

10. The method of claim 5, wherein the memory arrays includes a plurality of programmable memory cell transistors connected in series, and a first programmable selection transistor and second programmable selection transistor are connected in series to the plurality of programmable memory cell transistors, and wherein
    the restricting applies the first voltage to the first programmable selection transistor as the first programmable transistor.

11. The method of claim 5, wherein the memory arrays includes a plurality of programmable memory cell transistors connected in series to a programmable selection transistor, and wherein the restricting applies the first voltage to the programmable selection transistor as the first programmable transistor and a memory cell transistor adjacent the first programmable transistor as the second programmable transistor.

12. The method of claim 5, wherein the memory arrays includes a plurality of programmable memory cell transistors connected in series, a first programmable selection transistor and second programmable selection transistor are connected in series to a first end of the plurality of programmable memory cell transistors, a third programmable selection transistor and fourth programmable selection transistor are connected in series to a second end of the plurality of programmable memory cell transistors, and wherein the restricting applies the first voltage to the first programmable selection transistor as the first programmable transistor.

13. The method of claim 3, wherein the first voltage is less than the second voltage.

14. A memory, comprising:
a memory array having a plurality of memory strings, at least one memory string including a first selection transistor and a second selection transistor connected in series to a plurality of memory cell transistors, and the first selection transistor, the second selection transistor and the plurality of memory cell transistors being programmable transistors;
a drive unit configured to apply voltages to a plurality of word lines, each of the plurality of word lines connected to a gate of a respective one of the plurality of memory cell transistors, and the drive unit configured to apply voltages to first and second selection lines connected to gates of the first and second selection transistors, respectively; and
a control unit configured to control the drive unit such that during an erase operation, electrons are restricted from flowing from the first selection transistor into the second selection transistor.

15. The memory of claim 14, wherein the first selection transistor is a dummy selection transistors and has a same size as the plurality of memory cell transistors, and the second selection transistor has a size larger than the plurality of memory cell transistors.

16. The memory of claim 14, wherein the control unit is configured to control the drive unit to apply a first voltage to a control gate of the first selection transistor.

17. The memory of claim 16, wherein the control unit is configured to control the drive unit to apply a second voltage to at least a portion of the substrate including the plurality of memory cell transistors during the erase operation.

18. The memory of claim 17, further comprising:
applying a third voltage to a gate of at least one of the plurality of memory cell transistors during the erase operation such that the memory cell transistor obtains an erased state.

19. The memory of claim 18, wherein the first voltage is greater than the third voltage and less than the second voltage.

20. The memory of claim 19, wherein the control unit is configured to control the drive unit to apply the first voltage based on the second voltage.

21. The memory of claim 20, wherein the control unit is configured to control the drive unit to apply the first voltage a period of time after application of the second voltage.

22. The memory of claim 21, wherein
the control unit includes,
a voltage divider configured to divide the second voltage and produce a divided voltage; and a comparator configured to compare the divided voltage to a reference voltage and produce a comparison result; and
the drive unit is configured to start applying the first voltage based on the comparison result.

23. The memory of claim 20, wherein the control unit is configured to control the drive unit to apply the first voltage such that the first voltage is proportional to the second voltage.

24. The memory of claim 23, wherein
the control unit includes,
a voltage divider configured to divide the second voltage and produce a divided voltage; and
a differential amplifier configured to receive the divided voltage and an output of the differential amplifier as inputs; and
the drive unit configured to apply the output of the differential amplifier as the first voltage.

25. The memory of claim 14, wherein the first selection transistor, the second selection transistor and the plurality of memory cell transistors are one of floating gate type transistors and charge trap flash type transistors.

26. A memory, comprising:
a memory array having a plurality of memory strings, at least one memory string including a first selection transistor connected in series to a plurality of memory cell transistors, and the first selection transistor and the plurality of memory cell transistors being programmable transistors;
a drive unit configured to apply voltages to a plurality of word lines, each of the plurality of word lines connected to a gate of a respective one of the plurality of memory cell transistors, and the drive unit configured to apply a voltage to a first selection line connected to a gate of the first selection transistor; and
a control unit configured to control the drive unit such that during an erase operation, electrons are restricted from flowing to the first selection transistor from the plurality of memory cell transistors.

27. The memory of claim 26, wherein the first selection transistor has a size larger than the plurality of memory cell transistors.

28. The memory of claim 26, wherein the control unit is configured to control the drive unit to apply a first voltage to a control gate of the first selection transistor.

29. The memory of claim 28, wherein the control unit is configured to control the drive unit to apply a second voltage to at least a portion of the substrate including the plurality of memory cell transistors during the erase operation.

30. The memory of claim 29, further comprising:
applying a third voltage to a gate of at least one of the plurality of memory cell transistors during the erase operation such that the memory cell transistor obtains an erased state.

31. The memory of claim 30, wherein the first voltage is greater than the third voltage and less than the second voltage.

32. The memory of claim 31, wherein the control unit is configured to control the drive unit to apply the first voltage based on the second voltage.

33. The memory of claim 32, wherein the control unit is configured to control the drive unit to apply the first voltage a period of time after application of the second voltage.

34. The memory of claim 33, wherein
the control unit includes,
a voltage divider configured to divide the second voltage and produce a divided voltage; and a comparator configured to compare the divided voltage to a reference voltage and produce a comparison result; and the drive unit is configured to start applying the first voltage based on the comparison result.

35. The memory of claim 32, wherein the control unit is configured to control the drive unit to apply the first voltage such that the first voltage is proportional to the second voltage.

36. The memory of claim 35, wherein
the control unit includes,
a voltage divider configured to divide the second voltage and produce a divided voltage; and
a differential amplifier configured to receive the divided voltage and an output of the differential amplifier as inputs; and
the drive unit configured to apply the output of the differential amplifier as the first voltage.

37. The memory of claim 26, wherein the first selection transistor and the plurality of memory cell transistors are one of floating gate type transistors and charge trap flash type transistors.

38. A card, comprising:
a memory, the memory including,
a memory array having a plurality of memory strings, at least one memory string including a first selection transistor and a dummy selection transistor connected in series to a plurality of memory cell transistors, and the first selection transistor, the dummy selection transistor and the plurality of memory cell transistors being programmable transistors,
a drive unit configured to apply voltages to a plurality of word lines, each of the plurality of word lines connected to a gate of a respective one of the plurality of memory cell transistors, and the drive unit configured to apply voltage to first and second selection lines connected to gates of the first and dummy selection transistors, respectively, and
a control unit configured to control the drive unit such that during an erase operation, electrons are restricted from flowing from the first selection transistor into the dummy selection transistor; and
a controller configured to control the memory.

39. A system, comprising:
a bus;
a semiconductor device connected to the bus, the semiconductor device including,
a memory array having a plurality of memory strings, at least one memory string including a first selection transistor and a dummy selection transistor connected in series to a plurality of memory cell transistors, and the first selection transistor, the dummy selection transistor and the plurality of memory cell transistors being programmable transistors,
a drive unit configured to apply voltages to a plurality of word lines, each of the plurality of word lines connected to a gate of a respective one of the plurality of memory cell transistors, and the drive unit configured to apply voltage to first and second selection lines connected to gates of the first and dummy selection transistors, respectively, and
a control unit configured to control the drive unit such that during an erase operation, electrons are restricted from flowing from the first selection transistor into the dummy selection transistor; and
an input/output device connected to the bus; and
a processor connected to the bus, the processor configured to communicate with the input/output device and the semiconductor device via the bus.

* * * * *